United States Patent
Kawashima et al.

(10) Patent No.: US 9,947,613 B2
(45) Date of Patent: Apr. 17, 2018

(54) POWER SEMICONDUCTOR DEVICE AND METHOD FOR MANUFACTURING THE SAME

(71) Applicant: Mitsubishi Electric Corporation, Tokyo (JP)

(72) Inventors: Hiroshi Kawashima, Tokyo (JP); Ken Sakamoto, Tokyo (JP); Satoshi Kondo, Tokyo (JP); Taketoshi Shikano, Tokyo (JP); Yoshihiro Takai, Tokyo (JP); Claudio Feliciani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/508,118

(22) PCT Filed: Nov. 7, 2014

(86) PCT No.: PCT/JP2014/079554
§ 371 (c)(1),
(2) Date: Mar. 2, 2017

(87) PCT Pub. No.: WO2016/072012
PCT Pub. Date: May 12, 2016

(65) Prior Publication Data
US 2017/0294369 A1    Oct. 12, 2017

(51) Int. Cl.
*H01L 23/00* (2006.01)
*H01L 23/495* (2006.01)
(Continued)

(52) U.S. Cl.
CPC ...... *H01L 23/49537* (2013.01); *H01L 21/565* (2013.01); *H01L 23/3107* (2013.01);
(Continued)

(58) Field of Classification Search
CPC ....... H01L 2224/49171; H01L 23/3107; H01L 24/85; H01L 23/49503; H01L 2924/19105
See application file for complete search history.

(56) References Cited

U.S. PATENT DOCUMENTS 5,079,190 A   1/1992   Mihara
5,920,768 A   7/1999   Shintai
(Continued)

FOREIGN PATENT DOCUMENTS

JP   H02-001179 A   1/1990
JP   H10-178030 A   6/1998
(Continued)

OTHER PUBLICATIONS

International Search Report issued in PCT/JP2014/079554; dated Jan. 27, 2015.
(Continued)

*Primary Examiner* — Ngan Ngo
(74) *Attorney, Agent, or Firm* — Studebaker & Brackett PC

(57) ABSTRACT

A power semiconductor device includes a power semiconductor element, a controlling element, a first lead frame and a second lead frame, respectively, a first metal wire electrically connecting the power semiconductor element and the first lead frame, and a sealing body covering these components. The first lead frame includes a first inner lead having a connecting surface to which one end of the first metal wire is connected. Among surfaces of the sealing body, in a side surface, a resin inlet mark is formed in a side surface portion from which the first lead frame and the second lead frame do not project, the resin inlet mark being greater in surface roughness than another area. The resin inlet mark is formed
(Continued)

opposite to a side where the first metal wire is positioned on the connecting surface when seen in the direction along the mounting surface.

3 Claims, 6 Drawing Sheets

(51) Int. Cl.
    *H01L 21/56*     (2006.01)
    *H01L 23/498*    (2006.01)
    *H01L 23/31*     (2006.01)

(52) U.S. Cl.
    CPC .. *H01L 23/49503* (2013.01); *H01L 23/49513* (2013.01); *H01L 23/49555* (2013.01); *H01L 23/49558* (2013.01); *H01L 23/49861* (2013.01); *H01L 24/32* (2013.01); *H01L 24/48* (2013.01); *H01L 24/73* (2013.01); *H01L 24/85* (2013.01); *H01L 2224/32245* (2013.01); *H01L 2224/48108* (2013.01); *H01L 2224/48137* (2013.01); *H01L 2224/48245* (2013.01); *H01L 2224/49171* (2013.01); *H01L 2224/73265* (2013.01); *H01L 2924/19105* (2013.01)

(56) References Cited

U.S. PATENT DOCUMENTS

| | | |
|---|---|---|
| 6,002,166 A | 12/1999 | Noda et al. |
| 2004/0262723 A1 | 12/2004 | Qin et al. |
| 2007/0004092 A1 | 1/2007 | Suzuki et al. |
| 2010/0052125 A1* | 3/2010 | Sasaki ................ B23K 20/005 257/676 |
| 2010/0219517 A1 | 9/2010 | Yoshiba et al. |
| 2014/0131846 A1 | 5/2014 | Shiramizu et al. |
| 2014/0206122 A1* | 7/2014 | Fernandez ............ H01L 21/565 438/48 |
| 2014/0231975 A1* | 8/2014 | Denta ................ H01L 23/3114 257/666 |
| 2017/0317001 A1* | 11/2017 | Otremba ........... H01L 23/49562 |

FOREIGN PATENT DOCUMENTS

| | | |
|---|---|---|
| JP | 2004-172239 A | 6/2004 |
| JP | 2005-019554 A | 1/2005 |
| JP | 2007-165425 A | 6/2007 |
| JP | 2010-109315 A | 5/2010 |
| JP | 2014-099547 A | 5/2014 |
| JP | 2014-116366 A | 6/2014 |
| JP | 2014-127561 A | 7/2014 |
| WO | 98/24122 A1 | 6/1998 |
| WO | 2005/024933 A1 | 3/2005 |

OTHER PUBLICATIONS

An Office Action; "Notification of Reasons for Refusal," mailed by the Japanese Patent Office dated Feb. 13, 2018, which corresponds to Japanese Patent Application No. 2016-557421 and is related to U.S. Appl. No. 15/508,118; with English Translation.

* cited by examiner

POWER SEMICONDUCTOR DEVICE AND METHOD FOR MANUFACTURING THE SAME

TECHNICAL FIELD

The present invention relates to a power semiconductor device and a method for manufacturing the same, and more particularly to a power semiconductor device sealed by a sealing body, and a method for manufacturing the same.

BACKGROUND ART

Among semiconductor devices, a power semiconductor device is used for controlling and rectifying relatively large electric power in a vehicle, such as a railroad vehicle, a hybrid car and an electric vehicle, a consumer electronic device, an industrial machine, and the like. High heat dissipation is required of a power semiconductor device since when in use a power semiconductor element generates heat. A high insulation property with respect to the outside is also required of a power semiconductor element since a high voltage more than several hundred volts is applied thereto.

Here, an IPM (Intelligent Power Module) is a module into which a power semiconductor element and a controlling semiconductor element (hereinafter briefly referred to as a controlling element) are integrated. When a lead frame is used as a wiring material in an IPM, the power semiconductor element and the controlling element are mounted on physically-separated two lead frames, respectively. Specifically, the power semiconductor element and the controlling element are mounted on die pads provided on the lead frames, respectively. The power semiconductor element is electrically connected to the lead frame via a power metal thin wire, and the controlling element is electrically connected to the lead frame via a metal wire. Such an IPM is in general resin-sealed by transfer molding to be formed into a sealing body.

Japanese Patent Laying-Open No. 2004-172239 describes a resin-sealed semiconductor device in which a controlling support plate is supported at a position higher than a heat sink, and a compressive force by ultrasonic thermocompression bonding is strongly applied to a connecting lead thin wire to firmly bond this connecting lead thin wire to each of a controlling element and a controlling lead terminal.

CITATION LIST

Patent Document

PTD 1: Japanese Patent Laying-Open No. 2004-172239

SUMMARY OF INVENTION

Technical Problem

In a mold generally used for transfer molding when producing an IMP, however, a resin inlet (gate) is provided to connect to the inner peripheral surface on which the side surface of a sealing body is to be molded. Therefore, when using a metal thin wire having a thin wire diameter for interconnecting semiconductor elements in an IMP, the metal thin wire is likely to be deformed due to a flow resistance received from molding resin during transfer molding even if a compressive force by ultrasonic thermocompression bonding is increased as described above. If deformation of this metal thin wire occurs, the metal thin wire and another conductive part, for example, may be brought into contact with each other to cause a failure, such as a wire short.

The present invention was made to solve the above problem. A main object of the present invention is to provide a power semiconductor device in which deformation of a metal thin wire is restrained, and a method for manufacturing the same.

Solution to Problem

A power semiconductor device according to the present invention includes a power semiconductor element, a controlling element configured to control the power semiconductor element, a first lead frame and a second lead frame configured to hold the power semiconductor element and the controlling element, respectively, a first metal wire configured to electrically connect the power semiconductor element and the first lead frame, a second metal wire configured to electrically connect the power semiconductor element and the controlling element, and a sealing body configured to cover the power semiconductor element, the controlling element, part of the first lead frame and the second lead frame, the first metal wire, and the second metal wire. The first lead frame includes a die pad on which the power semiconductor element is mounted, a first inner lead connecting to the die pad, being arranged inside the sealing body and having a connecting surface to which one end of the first metal wire is connected, and a first outer lead connecting to the first inner lead, being positioned opposite to the die pad and being arranged outside the sealing body. The second lead frame includes a second inner lead on which the controlling element is mounted and being arranged inside the sealing body and a second outer lead connecting to the second inner lead and being arranged outside the sealing body. Among surfaces of the sealing body, in a side surface crossing a direction along a mounting surface of the die pad on which the power semiconductor element is mounted, a resin inlet mark is formed in a side surface portion from which the first lead frame and the second lead frame do not project, the resin inlet mark being greater in surface roughness than another area of the side surface. The resin inlet mark is formed opposite to a side where the first metal wire is positioned on the connecting surface of the first inner lead when seen in a direction along the mounting surface.

Advantageous Effects of Invention

According to the present invention, the power semiconductor device in which deformation of a metal thin wire is restrained, and a method for manufacturing the same can be provided.

DESCRIPTION OF EMBODIMENTS

Figure 1:
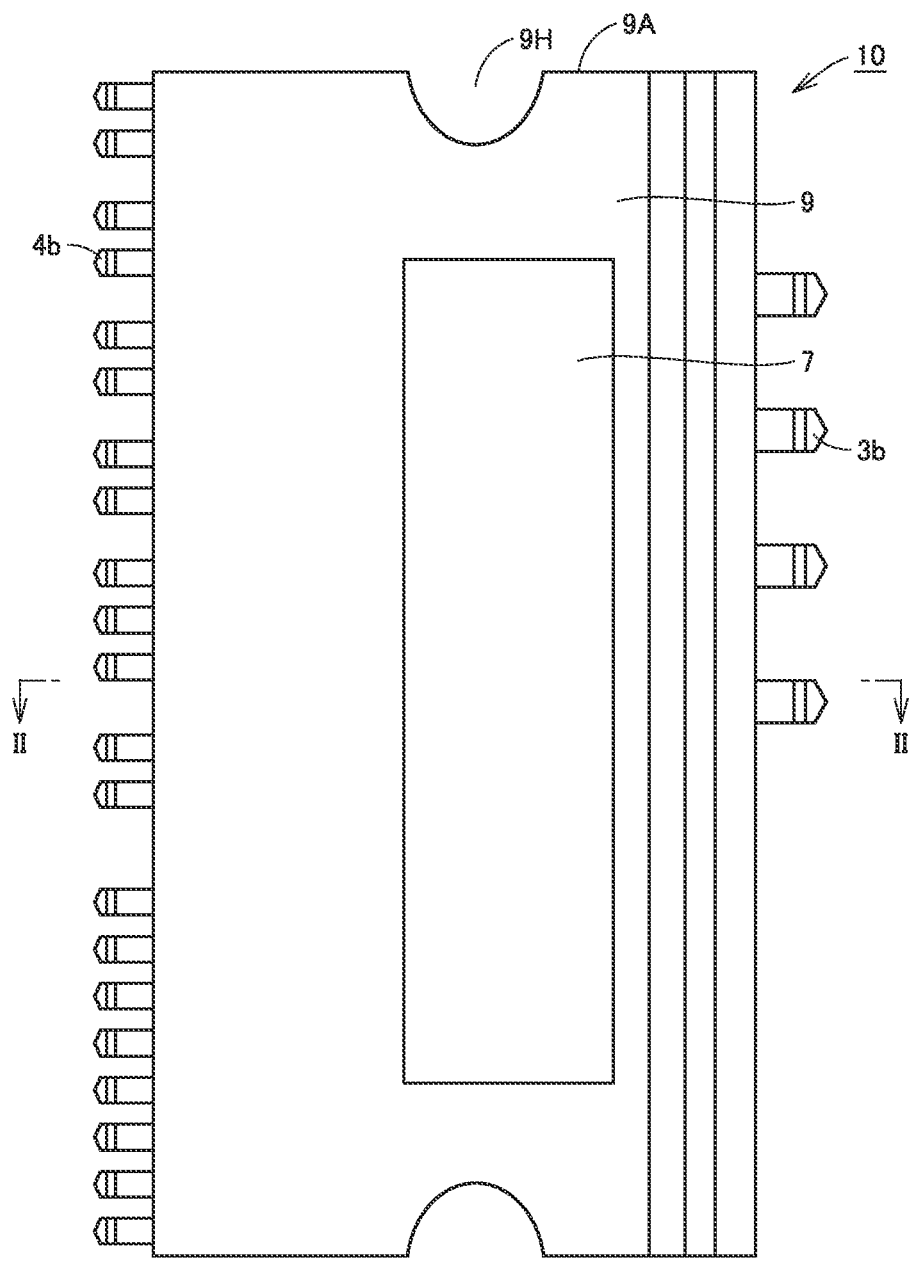
FIG. 1 is a back side view for describing a power semiconductor device according to a present embodiment.

Hereinafter, an embodiment of the present invention will be described in detail with reference to the drawings. It is noted that, in the drawings, the same or corresponding portions have the same reference characters allotted, and description thereof will not be repeated.

Referring to FIGS. 1 to 9, a power semiconductor device according to the present embodiment and a method for manufacturing the same will be described.

A power semiconductor element 1 may be any power semiconductor element, and is a RC-IGBT (Reverse Conducting-Insulated Gate Bipolar Transistor), for example. In this case, a source electrode (not shown) and a gate electrode (not shown), for example, are formed on a surface of power semiconductor element 1. A controlling element 2 is any semiconductor element constituting an electronic circuit for controlling power semiconductor element 1.

Figure 2:
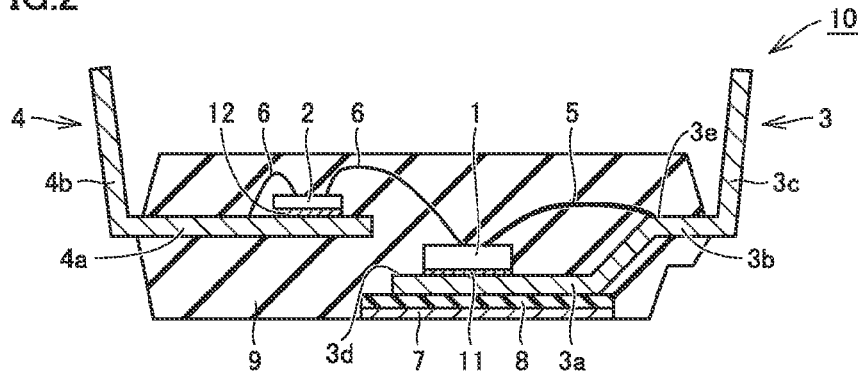
FIG. 2 is a sectional view taken along the line II-II in FIG. 1.

As shown in FIG. 2, a first lead frame 3 has a die pad 3a and a first inner lead 3b provided inside sealing body 9 as well as a first outer lead 3c exposed to the outside of sealing body 9.

Die pad 3a has a mounting surface 3d provided such that power semiconductor element 1 can be mounted thereon, and is soldered to and holds power semiconductor element 1 with a solder 11 interposed on the mounting surface. Solder 11 is a lead (Pb)-free solder, for example. Instead of solder 11, a conductive bonding material, such as a conductive adhesive, may be used for bonding power semiconductor element 1 and die pad 3a.

First inner lead 3b is formed to connect to die pad 3a, and has a connecting surface 3e connected to an Al wire 5 which will be described later. First inner lead 3b has a portion bent with respect to die pad 3a in the direction perpendicular to the above-described mounting surface, for example. In other words, connecting surface 3e has a predetermined height from the above-described mounting surface. Here, the predetermined height is larger than the thickness of power semiconductor element 1 (the height of power semiconductor element 1 from the above-described mounting surface of the pad surface to which Al wire 5 which will be described later is bonded), for example.

First outer lead 3c is formed to connect to first inner lead 3b, and has a height from above-described mounting surface 3d which is equal to above-described connecting surface 3e in the above-described perpendicular direction, for example. Here, the predetermined height is larger than the thickness of power semiconductor element 1 (the height of power semiconductor element 1 from the above-described mounting surface of the pad surface to which Al wire 5 which will be described later is bonded), for example.

A second lead frame 4 has a second inner lead 4a provided inside sealing body 9 and a second outer lead 4b exposed to the outside of sealing body 9.

Second inner lead 4a has a mounting surface provided such that controlling element 2 can be mounted thereon, and is soldered to and holds controlling element 2 with a conductive adhesive 12 interposed on the mounting surface. Second outer lead 4b is formed to connect to second inner lead 4a.

Power semiconductor element 1 and first lead frame 3 are electrically connected to each other via a first metal wire. The first metal wire may have any configuration as long as power semiconductor element 1 and first lead frame 3 can be electrically connected to each other, and may be a wire made of a metal material or an alloy material including at least one selected from among aluminum (Al), copper (Cu), silver (Ag), and any other metals, for example. The first metal wire is Al wire 5 containing Al as a main constituent, for example. When power semiconductor element 1 is a RC-IGBT, Al wire 5 has one end connected to connecting surface 3e of first lead frame 3 and the other end positioned opposite to the one end electrically connected to a source electrode, for example.

There may be a plurality of Al wires 5 between one source electrode and one first lead frame 3, for example. An area filled up with sealing body 9 is formed between Al wire 5 and first lead frame 3.

Power semiconductor element 1 and controlling element 2 are electrically connected controlling element 2 and second lead frame 4, respectively, via a second metal wire. The second metal wire may have any configuration as long as power semiconductor element 1 and controlling element 2 can be electrically connected to controlling element 2 and second lead frame 4, respectively, and may be a wire made of a metal material or an alloy material including at least one selected from among gold (Au), Cu, Ag, and any other metals, for example. The second metal wire is an Au wire 6 containing Au as a main constituent, for example. When power semiconductor element 1 is a RC-IGBT, Au wire 6 electrically connects the gate electrode of power semiconductor element 1 and controlling element 2, for example. There may be a plurality of Au wires 6 between one gate electrode and one controlling element 2 and between one controlling element 2 and one second lead frame 4, respectively.

Figure 3:
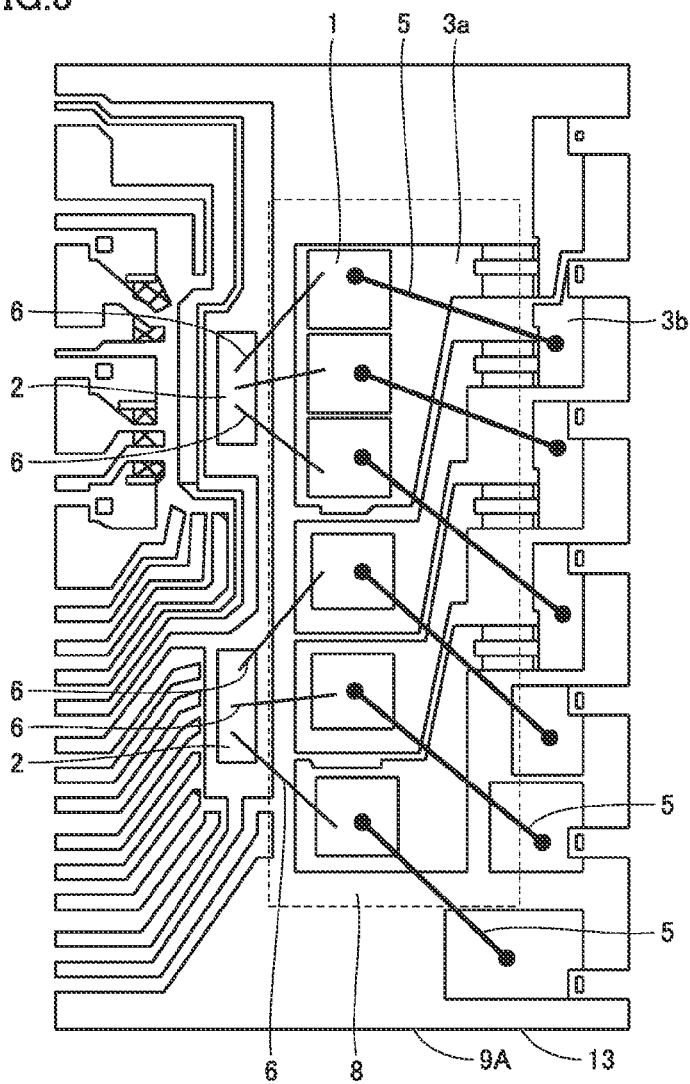
FIG. 3 is a top view for describing the power semiconductor device according to the present embodiment.

FIG. 3 is a plan view for describing planar arrangement of components of power semiconductor device 10 except for sealing body 9. As shown in FIG. 3, Al wire 5 and Au wire 6 are provided to be aligned in a certain direction when power semiconductor device 10 is seen in plan view. In power semiconductor element 1, for example, the portion bonded to Al wire 5 is positioned closer to first lead frame 3 to which Al wire 5 is bonded than the portion bonded to Au wire 6. Al wire 5 and Au wire 6 are formed such that Au wire 6 connects to controlling element 2 in the direction that Al wire 5 extends, as seen from a resin inlet mark 13 which will be described later. In particular, Al wire 5 which is the closest to resin inlet mark 13 is formed to extend from resin inlet mark 13 toward controlling element 2 in plan view. In other words, Al wire 5 which is the closest to resin inlet mark 13 is formed to extend in the direction that Au wire 6 connected to power semiconductor element 1 to which Al wire 5 is connected extends.

Al wire 5 is provided to have a wire diameter larger than Au wire 6, and has a wire diameter of more than or equal to 100 μm to less than or equal to 500 μm, while Au wire 6 has a wire diameter of more than or equal to 20 μm to less than or equal to 60 μm.

Die pad 3a of first lead frame 3 is arranged on a metal plate 7 as a heat sink with an insulating film 8 interposed therebetween. Of metal plate 7, a surface (exposed surface) positioned opposite to a surface connected to insulating film 8 is exposed to the outside of sealing body 9. The material constituting metal plate 7 may be any material having a high thermal conductivity, such as Al or Cu, for example. The material constituting insulating film 8 may be any material functioning as an adhesive agent between die pad 3a and metal plate 7 and having electrical insulation and a high thermal conductivity, such as a thermally conductive epoxy resin, for example. The material constituting insulating film 8 may be a thermoplastic resin or may be a thermosetting resin. When insulating film 8 is made of resin, insulating film 8 may contain at least one of the group consisting of oxidized silicon ($SiO_2$), aluminum oxide ($Al_2O_3$), and boron nitride (BN), as a filler.

Sealing body 9 seals power semiconductor element 1, controlling element 2, die pad 3a, first inner lead 3b, second inner lead 4a, second outer lead 4b, Al wire 5, Au wire 6, part of metal plate 7, and insulating film 8. The material constituting sealing body 9 may be any material having electrical insulation, such as epoxy resin, for example. Sealing body 9 may have any shape. The outer shape of sealing body 9 when power semiconductor device 10 is seen in plan view is rectangular, for example, and first lead frame 3 and second lead frame 4 project from a pair of sides (side surfaces) opposed to each other, respectively. That is, power semiconductor device 10 is provided as a DIP (Dual Inline Package)-type package.

As shown in FIG. 3, in power semiconductor device 10, there may be a plurality of power semiconductor elements 1, a plurality of controlling elements 2, a plurality of first lead frames 3, and a plurality of second lead frames 4. In this case, plurality of power semiconductor elements 1 and plurality of first lead frames 3 are arranged in line with each other in a particular direction on metal plate 7 and insulating film 8, respectively, for example. Plurality of controlling elements 2 and plurality of second lead frames 4 are arranged in line with each other in the particular direction, for example. (Plurality of first lead frames 3 are provided to have an equal height from the exposed surface of metal plate 7 in the direction perpendicular to mounting surface 3d, for example. Plurality of second lead frames 4 are provided to have an equal height from the exposed surface of metal plate 7 in the direction perpendicular to mounting surface 3d, for example.)

Figure 4:
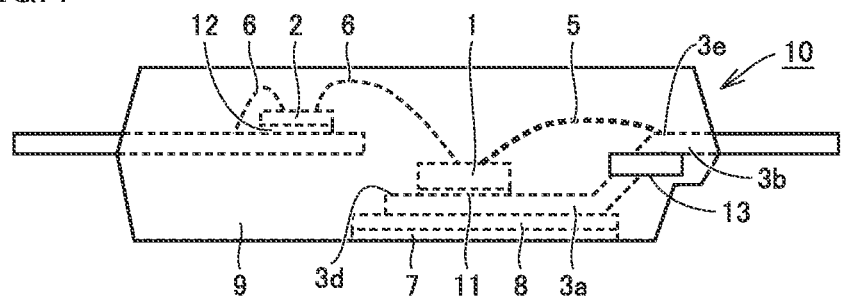
FIG. 4 is a side view for describing the power semiconductor device according to the present embodiment.
Figure 5:
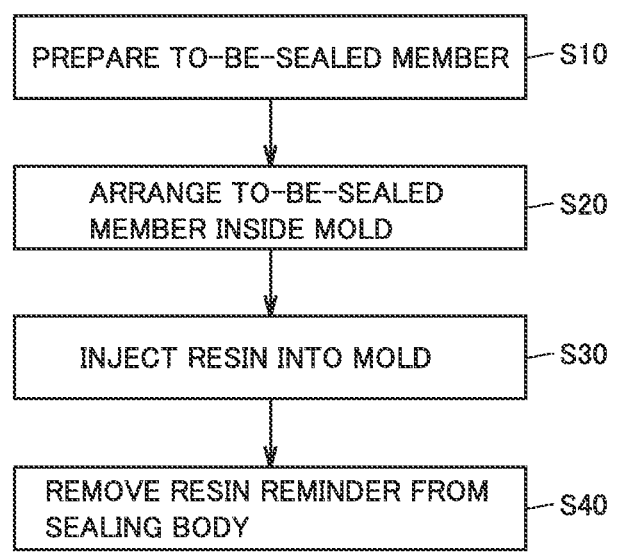
FIG. 5 is a flowchart of a method for manufacturing the power semiconductor device according to the present embodiment.
Figure 6:
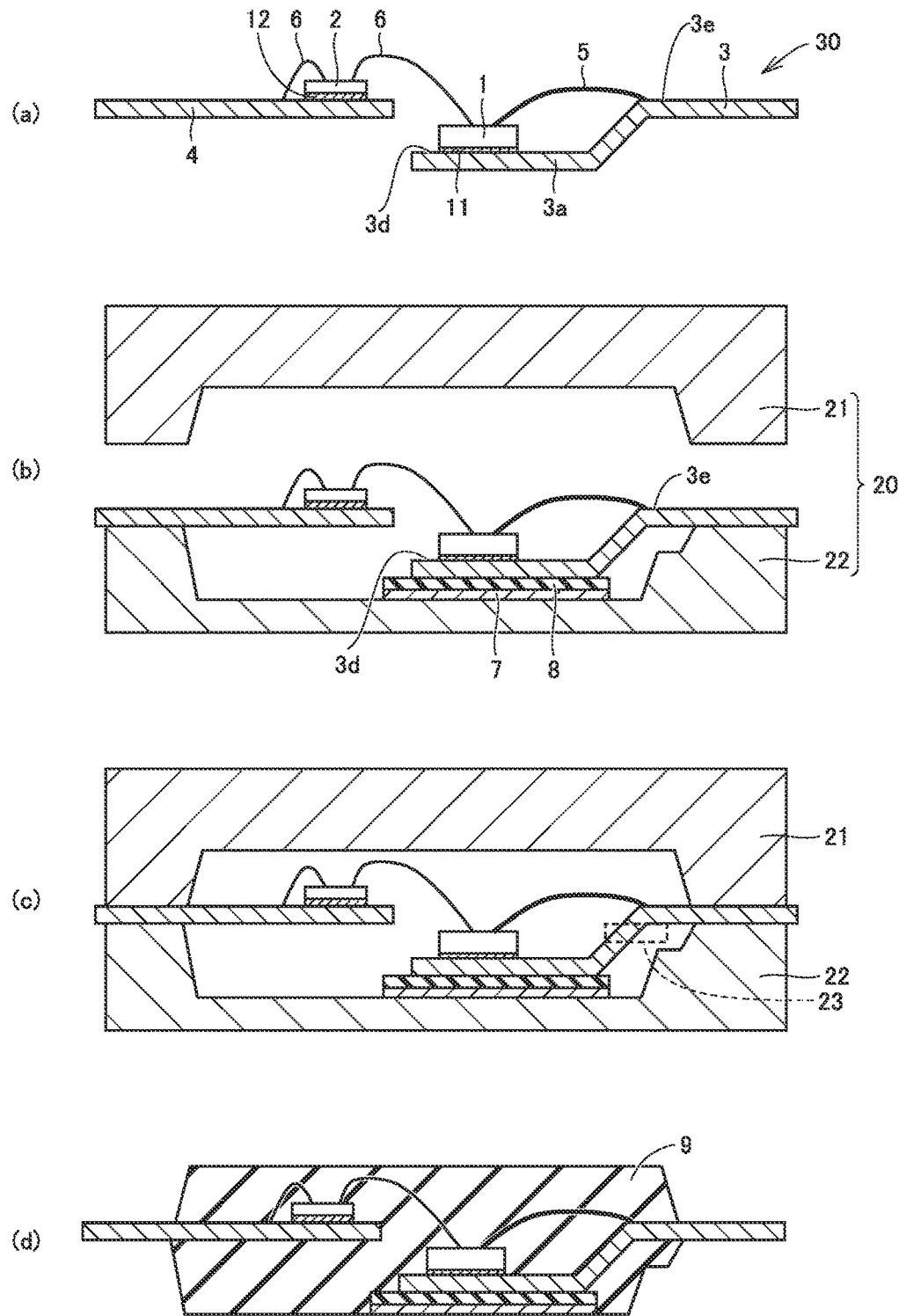
FIG. 6 is a sectional view for describing the method for manufacturing the power semiconductor device according to the present embodiment.

FIG. 4 is a side view for describing the positional relation in power semiconductor device 10 between resin inlet mark 13 formed in a side surface portion 9A of sealing body 9 as will be described later and components arranged inside sealing body 9, such as first lead frame 3, indicated by the broken lines. Referring to FIGS. 3 and 4, in a side surface of the surfaces of sealing body 9 seen in a direction along mounting surface 3d of die pad 3a on which power semiconductor element 1 is mounted, resin inlet mark 13 is formed in side surface portion 9A from which first lead frame 3 and second lead frame 4 do not project. Resin inlet mark 13 is formed by breaking a resin remainder 14 (see FIG. 9) resulting from an inlet 23 and a runner 24 formed in a mold 20 as shown in FIG. 6 when molding sealing body 9 by transfer molding (which will be described later in detail). Resin inlet mark 13 is formed as an area having a surface roughness (Rz) of more than or equal to 20 μm in side surface portion 9A of sealing body 9.

Resin inlet mark 13 is formed opposite to the side where Al wire 5 is positioned on connecting surface 3e in a direction crossing the direction along above-described mounting surface 3d. In other words, with power semiconductor device 10 arranged such that metal plate 7 is positioned at a lower position in the vertical direction than power semiconductor element 1, resin inlet mark 13 is provided to be positioned at a lower position in the vertical direction than connecting surface 3e.

Preferably, resin inlet mark 13 is provided to be positioned closer to die pad 3a than insulating film 8 in the direction perpendicular to mounting surface 3d. In other words, when metal plate 7 is arranged at a lower position in the vertical direction than power semiconductor element 1, resin inlet mark 13 is provided to be positioned at an upper position in the vertical direction than insulating film 8.

As shown in FIG. 3, resin inlet mark 13 is preferably formed closer to first outer lead 3c than power semiconductor element 1 when power semiconductor device 10 is seen in the direction along above-described mounting surface 3d. Resin inlet mark 13 is preferably formed to be aligned with each connecting surface 3e of plurality of first lead frames 3 in the direction in which plurality of first lead frames 3 are aligned.

Preferably, Al wire 5 and Au wire 6 are formed to connect to each other in the direction that Al wire 5 extends as seen from resin inlet mark 13 when power semiconductor device 10 is seen in plan view. For example, at least Al wire 5 provided at the position closest to resin inlet mark 13 and Au wire 6 are formed so as to connect to each other in the direction that Al wire 5 extends.

Next, referring to FIGS. 5 to 9, a method for manufacturing a power semiconductor device according to the present embodiment will be described.

FIG. 6 is a sectional view for describing each step of the method for manufacturing a power semiconductor device according to the present embodiment. First, a to-be-sealed member 30 including power semiconductor element 1, controlling element 2, first lead frame 3, second lead frame 4, Al wire 5, and Au wire 6 is prepared (step (S10)). Specifically, power semiconductor element 1 and first lead frame 3 are prepared first, and power semiconductor element 1 is adhered to die pad 3a of first lead frame 3 using Pb-free solder 11. Controlling element 2 and second lead frame 4 are prepared, and controlling element 2 is adhered to second inner lead 4a of second lead frame 4 using conductive adhesive 12. Next, Al wire 5 is formed between power semiconductor element 1 and first lead frame 3. Specifically, one end of Al wire 5 is bonded to connecting surface 3e of first inner lead 3b, and the other end is bonded to the source electrode of power semiconductor element 1. Au wire 6 is formed between controlling element 2 and second inner lead 4a. Furthermore, Au wire 6 is formed between power semiconductor element 1 and controlling element 2. In this manner, to-be-sealed member 30 shown in FIG. 6(a) is prepared.

Furthermore, a stack in which metal plate 7 and insulating film 8 are stacked is formed.

Next, referring to FIG. 6(b), to-be-sealed member 30 is arranged inside mold 20 (step (S20)). The inside of mold 20 (cavity) has a shape conforming to the outer shape of sealing body 9 in power semiconductor device 10. Mold 20 is composed of an upper mold 21 and a lower mold 22. Inlet 23 through which resin is to be injected into mold 20 and runner 24 for circulating resin to inlet 23 are formed in mold 20.

First, the stack of metal plate 7 and insulating film 8 is arranged inside mold 20. Specifically, the stack is arranged at a predetermined position in lower mold 22 such that metal plate 7 comes into contact with the bottom surface of the cavity of lower mold 22. Next, to-be-sealed member 30 is arranged such that die pad 3a overlaps insulating film 8. Accordingly, to-be-sealed member 30 is arranged inside mold 20 such that first outer lead 3c and second outer lead 4b are positioned on the outside with respect to the inside of mold 20.

Among the inner peripheral surfaces of mold 20 facing the inside of mold 20, in an inner peripheral side surface as seen in the direction along mounting surface 3d, inlet 23 is provided in a side surface portion which does not cross first lead frame 3 or second lead frame 4. Furthermore, inlet 23 is formed in first inner lead 3b opposite to the side where Al wire 5 is positioned on connecting surface 3e to which the one end of Al wire 5 is connected when seen in the direction along mounting surface 3d. Furthermore, at this time, inlet 23 is provided at a position not overlapping Au wire 6 when seen in the direction along mounting surface 3d. From a different viewpoint, inlet 23 is provided closer to first outer lead 3c than power semiconductor element 1 when seen in the direction along mounting surface 3d.

Referring to FIG. 6(c), after arranging to-be-sealed member 30 inside mold 20, by causing at least part of first outer lead 3c and at least part of second outer lead 4b to be held by upper mold 21 and lower mold 22, to-be-sealed member 30, metal plate 7 and insulating film 8 are enclosed by mold 20. At this time, insulating film 8 is in a half cured condition.

Figure 7:
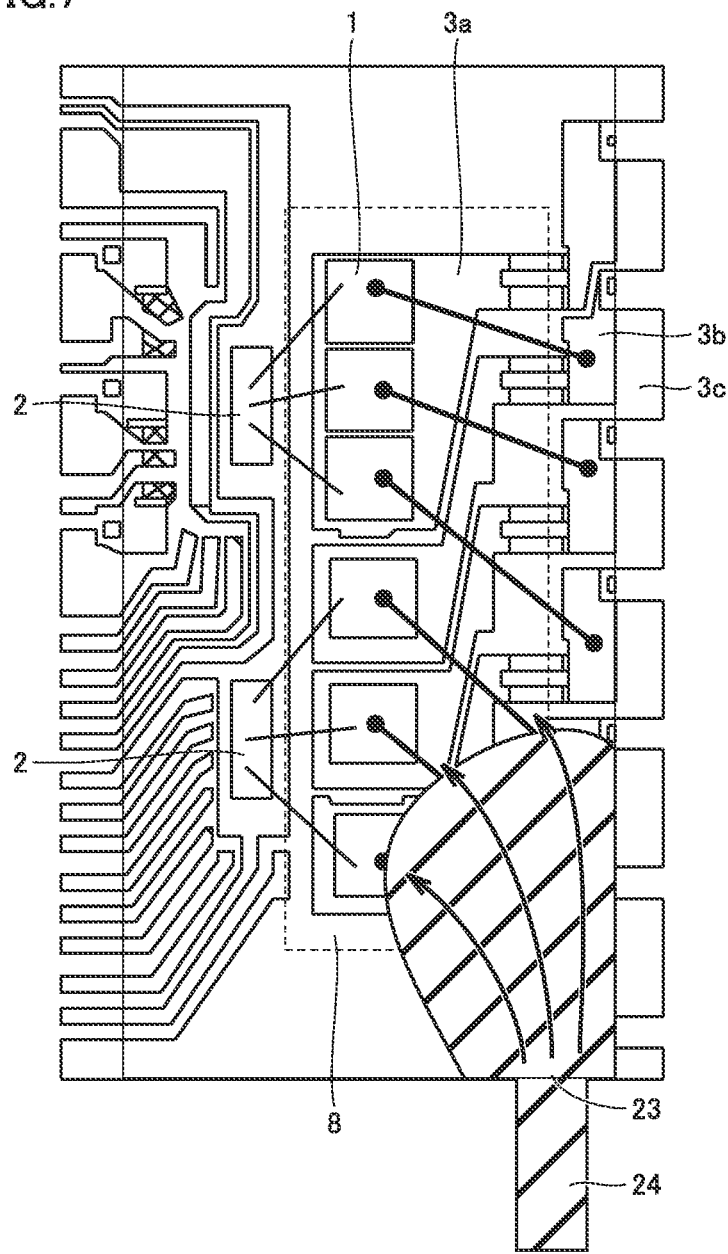
FIG. 7 is a drawing for describing a mold used in the method for manufacturing the power semiconductor device according to the present embodiment.
Figure 8:
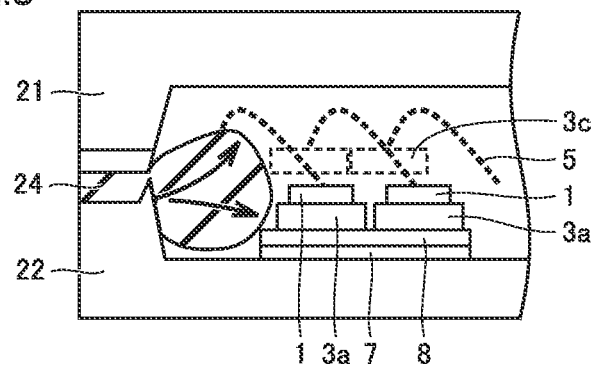
FIG. 8 is a drawing for describing the power semiconductor device according to the present embodiment.

Next, referring to FIGS. 7 and 8, resin is injected into mold 20 (step (S30)). FIG. 7 is a drawing for describing a flow of resin in the direction along mounting surface 3d inside mold 20 in this step (S30). FIG. 8 is a drawing for describing a flow of resin in the direction perpendicular to mounting surface 3d inside mold 20 in this step (S30).

First, solid resin in a half cured condition is melted by circulation inside heated mold 20. As shown in FIG. 7, the resin injected into mold 20 through inlet 23 first reaches Al wire 5 on first inner lead 3b, and then flows over power semiconductor element 1 on die pad 3a, Au wire 6, and controlling element 2 on second inner lead 4a in the order presented. Moreover, as shown in FIG. 8, the molten resin injected through inlet 23 flows downward in the vertical direction from inlet 23 (in the direction from the die pad 3a side to the metal plate 7 side). At this time, since insulating film 8 having been in a half cured condition is heated by mold 20 to be brought into a molten state, it is pressed toward metal plate 7 by die pad 3a having undergone isostatic pressing by the molten resin. Furthermore, the molten resin injected through inlet 23 also flows upward in the vertical direction from inlet 23. In other words, the normal vector on the surface of the molten resin tends in the direction that pushes up Al wire 5.

Next, the resin is cured inside mold 20 to form sealing body 9. At this time, die pad 3a and metal plate 7 are adhered to each other with insulating film 8 interposed therebetween.

Next, referring to FIG. 6(d), sealing body 9 is taken out from mold 20. At this time, the resin (resin remainder 14) cured inside runner 24 is taken out through inlet 23 continuously with sealing body 9.

Figure 9:
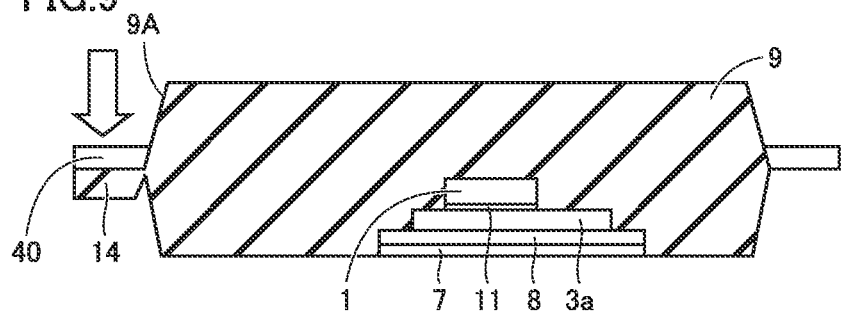
FIG. 9 is a sectional view for describing the power semiconductor device according to the present embodiment.

Next, above-described resin remainder 14 is removed from sealing body 9 (step (S40)). Referring to FIG. 9, by pressing resin remainder 14 from the upper side to the lower side in the vertical direction (in the direction from the die pad 3a side to the metal plate 7 side) by a pressing member 40, resin remainder 14 can be separated and removed from sealing body 9. In this way, power semiconductor device 10 according to the present embodiment shown in FIG. 4 can be obtained.

Next, operation effects of the power semiconductor element and a method for manufacturing the same according to the present embodiment will be described.

In power semiconductor device 10 according to the present embodiment, resin inlet mark 13 is formed opposite to the side where Al wire 5 is positioned on connecting surface 3e when seen in the direction along mounting surface 3d. In other words, in the method for manufacturing a power semiconductor device according to the present embodiment, inlet 23 through which resin is to be injected into mold 20 is provided in the side surface portion not crossing first lead frame 3 or second lead frame 4 among the inner peripheral surfaces of mold 20 facing the inside of mold 20, and is formed opposite to the side where Al wire 5 is positioned on connecting surface 3e when seen in the direction along mounting surface 3d.

Therefore, in the step (S30) of injecting resin into mold 20, the molten resin injected into mold 20 through inlet 23 can be flown so as to push up Al wire 5 positioned at an upper position in the vertical direction than this inlet 23. Therefore, the flow of resin as injected into mold 20 can restrain deformation of Al wire 5, such as forcing down of Al wire 5 in the direction along mounting surface 3d (in the direction that plurality of Al wires 5 are adjacent to each other, for example).

Therefore, in power semiconductor device 10, abnormal occurrence of leakage accompanying deformation of Al wire 5 or the like can be restrained, and power semiconductor device 10 may be manufactured with high yield. Since the method for manufacturing a power semiconductor device can restrain abnormal occurrence of leakage accompanying deformation of Al wire 5 or the like, power semiconductor device 10 can be manufactured with high yield.

Since inlet 23 is formed opposite to the side where Al wire 5 is positioned on connecting surface 3e when seen in the direction along mounting surface 3d, when removing resin remainder 14 from sealing body 9, resin remainder 14 can be removed from sealing body 9 by pressing resin remainder 14 from the upper side to the lower side in the vertical direction (in the direction from the die pad 3a side to the metal plate 7 side).

Provided that inlet 23 is formed on the side where Al wire 5 is positioned on connecting surface 3e (the upper side in the vertical direction) when seen in the direction along mounting surface 3d, the number of steps for removing resin remainder 14 is larger than in the present embodiment. Specifically, to remove resin remainder 14, it is necessary to use a removal device provided with a pressing member capable of pressing resin remainder 14 from the lower side to the upper side in the vertical direction, remove resin remainder 14 from power semiconductor device 10 by pressing resin remainder 14 from the lower side to the upper side by the pressing member, then take out power semiconductor device 10 from the above-described removal device, and thereafter discard resin remainder 14 from the pressing member.

That is, according to the method for manufacturing a power semiconductor device according to the present embodiment, resin remainder 14 can be easily removed from power semiconductor device 10, which can restrain increase in manufacturing costs.

Moreover, if resin inlet mark 13 is provided to be positioned closer to first lead frame 3 than insulating film 8 in the direction perpendicular to mounting surface 3d, in the step (S30) of injecting resin into mold 20, the molten resin injected into mold 20 through inlet 23 can be flown such that die pad 3a located at a lower position than inlet 23 in the vertical direction is pressed toward metal plate 7. At this time, since die pad 3a is pressed by the molten resin toward metal plate 7 with insulating film 8 brought into the molten state in this step (S30) interposed therebetween, the misalignment between die pad 3a and metal plate 7 due to the flow of the molten resin and the like can be restrained, and die pad 3a, insulating film 8 and metal plate 7 can be adhered together stably by curing the resin and insulating film 8.

If resin inlet mark 13 is formed closer to first outer lead 3c than power semiconductor element 1 when power semiconductor device 10 is seen in the direction along above-described mounting surface 3d, the distance between inlet 23 and Au wire 6 can be made longer than the distance between inlet 23 and Al wire 5 in the step (S30) of injecting resin into mold 20. That is, the time until the molten resin reaches Au wire 6 can be made longer than the time until it reaches Al wire 5.

Therefore, the resin injected into mold 20 can be further heated by mold 20 until it reaches Au wire 6 from inlet 23 to be brought into the state where melt viscosity is sufficiently low. Therefore, deformation of Au wire 6 due to the flow of the molten resin can be restrained.

Generally in transfer molding, resin immediately after injection into a mold through an inlet has a high melt viscosity because of insufficient heating. Therefore, if resin in such a state comes into contact with an Au wire having a thin wire diameter, the Au wire is likely to be deformed since the resin has a high drag to the Au wire. On the other hand, with the above-structure, Au wire 6 can be restrained from being deformed by the flow of the molten resin. As a result, power semiconductor device 10 can be manufactured with high yield, since a failure, such as a wire short resulting from deformation of Au wire 6 is restrained in power semiconductor device 10.

If Al wire 5 and Au wire 6 are formed to be aligned in the direction that Al wire 5 extends as seen from resin inlet mark 13 when power semiconductor device 10 is seen in plan view, a molten resin can be flown in the direction that Al wire 5 and Au wire 6 extend in the step (S30) of injecting resin into mold 20. As a result, deformation of Au wire 6 resulting from being pressed by the molten resin can be restrained more than in the case where a molten resin flows in the direction crossing the direction that Au wire 6 extends, and power semiconductor device 10 can be manufactured with high yield.

When a plurality of Al wires 5 and a plurality of Au wires 6 are formed, at least one of Al wires 5 and at least one of Au wires 6 provided at the closest position to resin inlet mark 13 may be formed to connect to each other in the direction that Al wire 5 extends. Then, the one of Au wires 6 provided at the closest position to inlet 23, which is most likely to undergo the flow resistance of the molten resin in the step (S30) of injecting resin into mold 20, can be restrained from being deformed as the molten resin flows in the direction that Au wire 6 extends.

Figure 10:
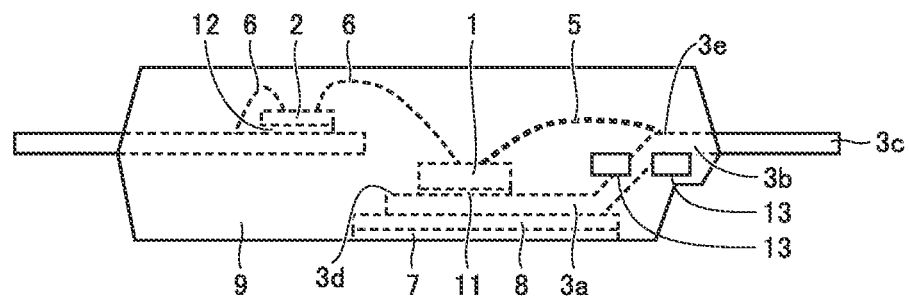
FIG. 10 is a side view for describing a variation of the power semiconductor device according to the present embodiment.

One resin inlet mark 13 is formed in power semiconductor device 10 according to the present embodiment, but this is not a limitation. Referring to FIG. 10, a plurality of resin inlet marks 13 may be formed. FIG. 10 is a side view for describing the positional relation between resin inlet marks 13 when a plurality of resin inlet marks 13 are formed and the components arranged inside sealing body 9, such as first lead frame 3, indicated by the broken lines, as a variation of power semiconductor device 10. In other words, a plurality of inlets 23 may be formed in mold 20. In this case, plurality of resin inlet marks 13 may be spaced in a direction parallel to mounting surface 3d when seen in the direction along mounting surface 3d. Then, effects equivalent to those of power semiconductor device 10 according to the present embodiment described above can also be achieved. This is not a limitation, but if each of plurality of inlets 23 is provided to have a structure equivalent to that of inlet 23 described above, effects equivalent to those of power semiconductor device 10 according to the present embodiment described above can be achieved.

Although an embodiment of the present invention has been described above, it should be understood that the embodiment disclosed herein is illustrative and non-restrictive in every respect. The scope of the present invention is defined by the claims, and is intended to include any modification within the meaning and scope equivalent to the terms of the claims.

REFERENCE SIGNS LIST 1 power semiconductor element;
2 controlling element;
3 first lead frame;
3a die pad;
3b first inner lead;
3c first outer lead;
3d mounting surface;
3e connecting surface;
4 second lead frame;
4a second inner lead;
4b second outer lead;
5, 6 wire;
7 metal plate;
8 insulating film;
9 sealing body;
9A side surface portion;
10 power semiconductor device;
11 solder;
12 conductive adhesive;
13 resin inlet mark;
14 resin remainder;
20 mold;
21 upper mold;
22 lower mold;
23 inlet;
24 runner;
30 to-be-sealed member;
40 pressing member.

The invention claimed is:

1. A power semiconductor device comprising:
   a power semiconductor element;
   a controlling element configured to control the power semiconductor element;
   a first lead frame and a second lead frame configured to hold the power semiconductor element and the controlling element, respectively;
   a first metal wire configured to electrically connect the power semiconductor element and the first lead frame;
   a second metal wire configured to electrically connect the power semiconductor element and the controlling element; and
   a sealing body configured to cover the power semiconductor element, the controlling element, part of the first lead frame and the second lead frame, the first metal wire, and the second metal wire, the first lead frame including a die pad on which the power semiconductor element is mounted, a first inner lead connecting to the die pad, being arranged inside the sealing body and having a connecting surface to which one end of the first metal wire is connected, and a first outer lead connecting to the first inner lead, being positioned opposite to the die pad and being arranged outside the sealing body, the second lead frame including a second inner lead on which the controlling element is mounted and being arranged inside the sealing body and a second outer lead connecting to the second inner lead and being arranged outside the sealing body, among surfaces of the sealing body, in a side surface crossing a direction along a mounting surface of the die pad on which the power semiconductor element is mounted, a resin inlet mark being formed in a side surface portion from which the first lead frame and the second lead frame do not project, the resin inlet mark being greater in surface roughness than another area of the side surface, the resin inlet mark being formed opposite to a side where the first metal wire is positioned on the connecting surface of the first inner lead when seen in the direction along the mounting surface.

2. The power semiconductor element according to claim 1, further comprising a metal plate to which a surface of the die pad positioned opposite to the mounting surface is connected with an insulating film interposed therebetween, wherein the metal plate is exposed at least partly to the outside of the sealing body, and the resin inlet mark is provided to be positioned closer to the die pad than the insulating film in a direction perpendicular to the mounting surface.

3. The power semiconductor element according to claim 1, wherein the second metal wire and the controlling element are formed to be aligned in the direction that the first metal wire extends as seen from the resin inlet mark when the power semiconductor element is seen in plan view.

* * * * *